United States Patent
Hsu et al.

(10) Patent No.: US 6,570,434 B1
(45) Date of Patent: May 27, 2003

(54) METHOD TO IMPROVE CHARGE PUMP RELIABILITY, EFFICIENCY AND SIZE

(75) Inventors: Louis Hsu, Fishkill, NY (US); Russell J. Houghton, Essex Junction, VT (US); Oliver Weinfurtner, Gilching (DE)

(73) Assignees: Infineon Technologies AG, Munich (DE); International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/662,685

(22) Filed: Sep. 15, 2000

(51) Int. Cl.$^7$ .............................. G05F 3/02; G05F 1/10
(52) U.S. Cl. ........................................................ 327/536
(58) Field of Search ................................. 327/536, 589, 327/309; 307/50, 45, 46, 47; 365/203

(56) References Cited

U.S. PATENT DOCUMENTS

| | | | | |
|---|---|---|---|---|
| 5,008,799 A | * | 4/1991 | Montalvo | 363/60 |
| 5,059,815 A | * | 10/1991 | Bill et al. | 327/536 |
| 6,028,473 A | * | 2/2000 | Kamei et al. | 327/536 |
| 6,245,467 B1 | * | 6/2001 | Peng et al. | 430/311 |
| 6,268,761 B1 | * | 7/2001 | Naganawa | 327/536 |
| 6,337,595 B1 | * | 1/2002 | Hsu et al. | 327/538 |

* cited by examiner

Primary Examiner—Terry D. Cunningham
Assistant Examiner—Quan Tra
(74) Attorney, Agent, or Firm—Stanton Braden

(57) ABSTRACT

A dynamic clamp is used in conjunction with capacitors with thinner dielectric or with deep trench capacitors to solve the problem of dielectric breakdown in high stress capacitors. The dynamic clamp is realized using a two stage pump operation cycle such that, during a first stage pump cycle, a middle node of a pair of series connected capacitors is pre-charged to a supply voltage and, during a second stage pump cycle, the middle node is coupled by a boost clock. Thus, at any moment in the pump operation cycle, the voltage across the capacitors is held within a safety range.

10 Claims, 12 Drawing Sheets

METHOD TO IMPROVE CHARGE PUMP RELIABILITY, EFFICIENCY AND SIZE

BACKGROUND OF THE INVENTION

1. Field of the Invention

The present invention generally relates to semiconductor structures and, more particularly, to a method to design a low-cost, high-performance charge pump system.

2. Background Description

In semiconductor capacitor structures, oxide reliability concern becomes more and more severe as the oxide thickness is further scaled down. Capacitor dielectric used in "high-stress" circuits could suffer dielectric breakdown if the devices are not properly protected. A general guideline for the dielectric reliability is shown in FIG. 1. If the thickness of the dielectric for a technology is chosen to be 55 nm (the vertical dash line), then for gate or capacitor devices with 10 mm$^2$ area can sustain a voltage V1 (about 2.2 volts) maximum use voltage without having a reliability concern. The smaller the over-all device area, the higher sustainable stress voltage is allowed for the device. On the other hand, the thinner the dielectric layer thickness, the lower the stress it can sustain for a given surface area. In a DRAM (dynamic random access memory) chip, many different kinds of charge pump circuits are required to provide different internally generated voltage levels. These pump circuits usually are equipped with several different sized boost capacitors made by planar capacitors. When the number of the pump circuits are increased, and the size of the boost capacitors used in the pump circuits, the reliability of the capacitor dielectric becomes a concern, especially for those capacitors operated at high voltage levels.

SUMMARY OF THE INVENTION

It is therefore an object of the present invention to provide a method to resolve the capacitor dielectric problem in a charge pump system.

It is another object of this invention to significantly reduce the pump size.

It is yet another object of the invention to improve the pump efficiency and capacity.

According to the invention, there is provided a dynamic clamp used in conjunction with capacitors with deep trench capacitors or other high-density capacitors, such as high-k dielectric and three dimensional (3D) stack capacitors. The dynamic clamp is realized using a two stage pump operation cycle such that, during a first stage pump cycle, a middle node of a pair of series connected capacitors is pre-charged to a supply voltage and, during a second stage pump cycle, the middle node is coupled by a boost clock. Thus, at any moment in the pump operation cycle, the voltage across the capacitors is held within a safety range.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
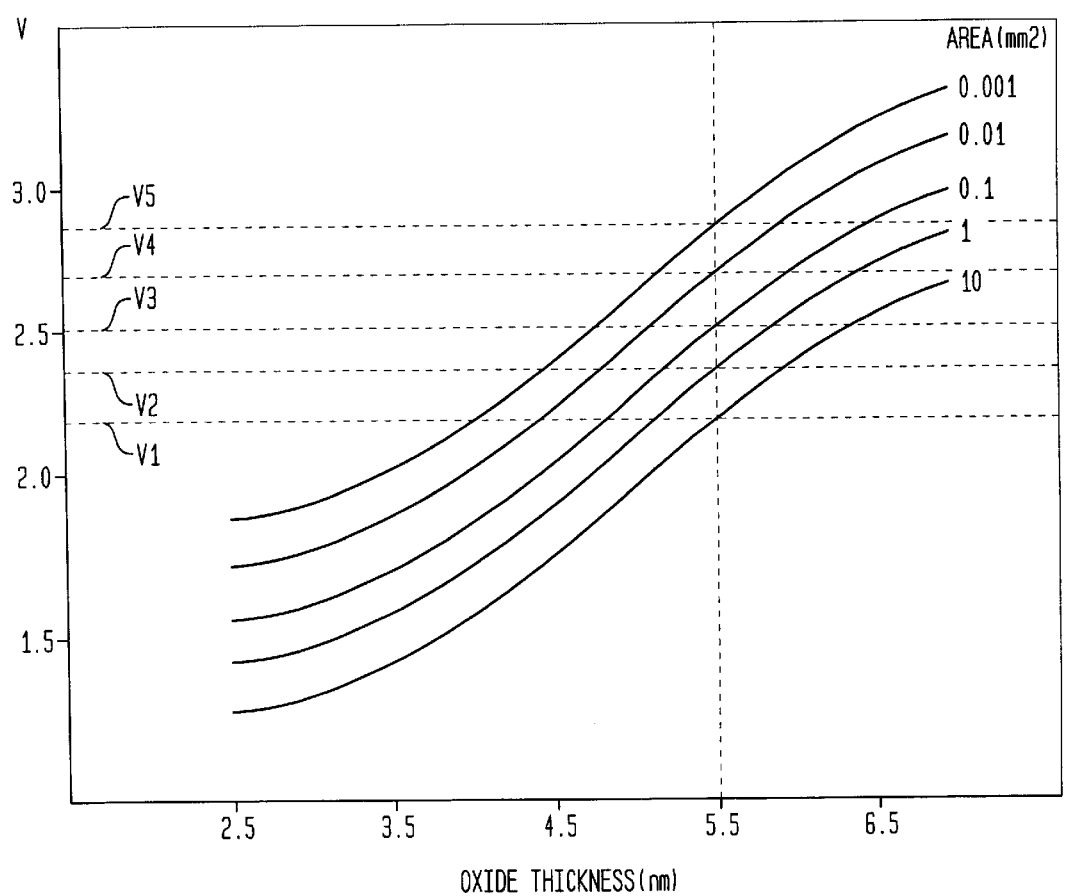
FIG. 1 is a graph showing the maximum use voltage as a function of oxide thickness and surface area.
Figure 2:
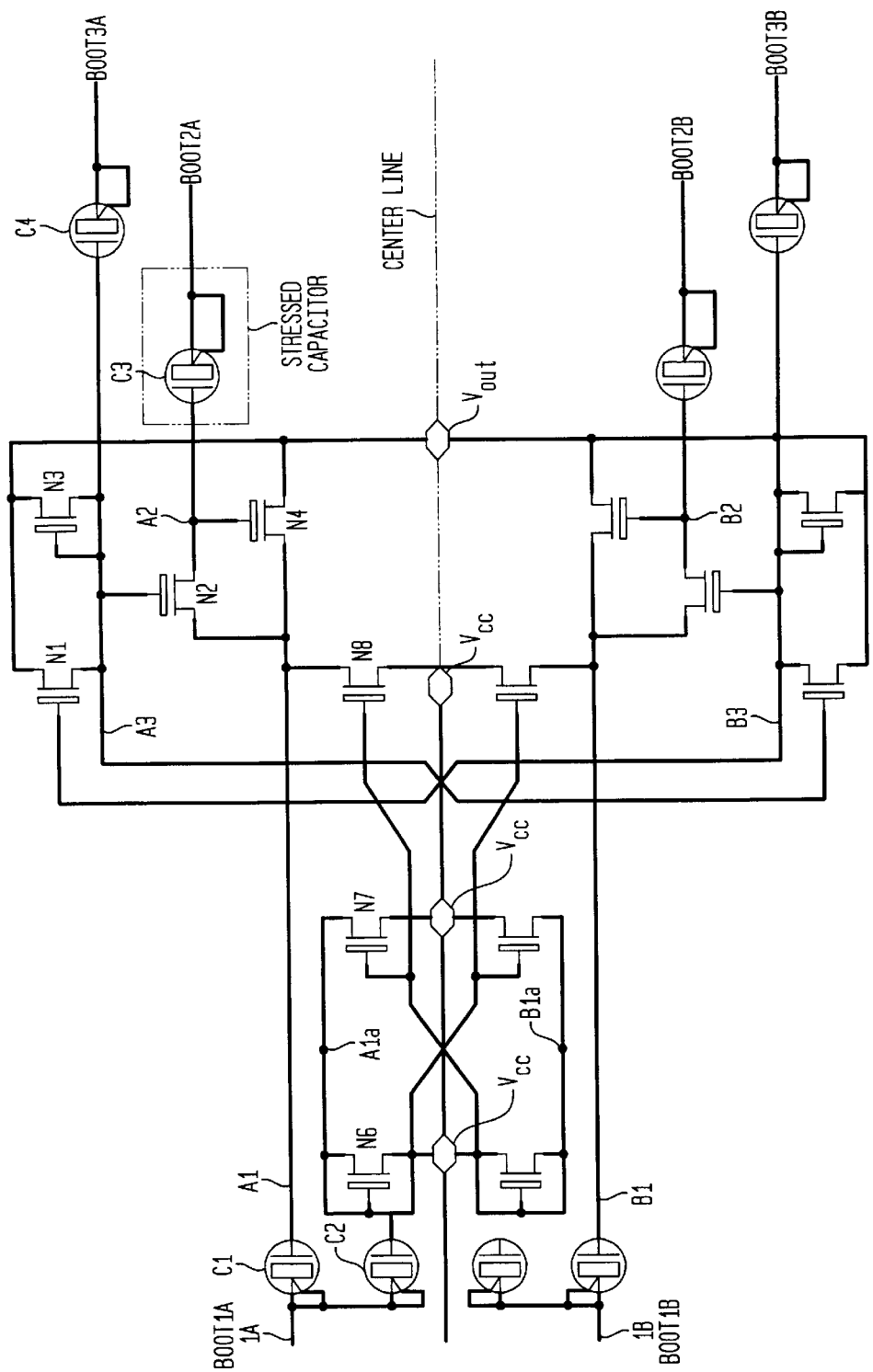
FIG. 2 is a schematic circuit diagram of a prior art charge pump circuit.

The invention is a method to prevent dielectric breakdown of semiconductor capacitor structures under excessive voltage stress. More specifically, the method according to the invention prevents dielectric break down of boost capacitors of a charge pump circuit as an example. A modern charge pump is illustrated in FIG. 2. Usually several different sized capacitors, C1, C2, C3, C4, etc., are used to boost the output voltage efficiently. The capacitor size varies from 50 Fm$^2$ to 4500 Fm$^2$. Normally, in each DRAM chip, up to forty pumps may be employed. Therefore, the overall stress area can be significant, and the breakdown probability is relatively high.

The pump has a symmetrical design. The upper portion of the circuit and the lower portion of the circuit are mirrored to the center line. An oscillator and a timing circuit (not shown) are used to generate the clocked boosted signals, BOOTA, BOOTB, etc. During the first half clock period, the upper portion of the circuit pumps the charge from supply to output, while during the second half period, the lower portion of the circuit continues the pump action. The detailed pumping sequence is like this. During a pre-charge period, the nodes A1, B1 are pre-charged to the supply voltage, or Vcc. In other words, the charge is first drawn from the supply to the A1 node. When BOOT1A clock applies a pulse from ground to VCC on capacitor C1, the other node A1 gets boosted to 2 Vcc. At the same time, node A1a on capacitor C2 is also boosted 2 Vcc from its precharge level of Vcc. This will keep the nodes B1a and B1 both at Vcc and ready for the second half cycle of pumping. When the A1 node is boosted to 2 Vcc, the BOOT3A clock boosts the A3 node from 2 Vcc to 3 Vcc while maintaining the B3 node at 2 Vcc. At this point, the A2 node is first boosted up from Vcc to 2 Vcc. But when the A3 node drops from 2 Vcc to Vcc, BOOT2A clock continues to boost the A2 node from 2 Vcc to 3 Vcc. Notice that all the levels mentioned above experience a nMOS (n-type Metal Oxide Semiconductor) device threshold voltage (Vthn) drop. The final voltage level of node A2 will reach to (3 Vcc-Vthn). The charge is thus drawn from node A1 to Vout. During the next pump cycle, charge is pumped from Vcc to node B2, and then from node B1 to Vout.

Figure 4A:
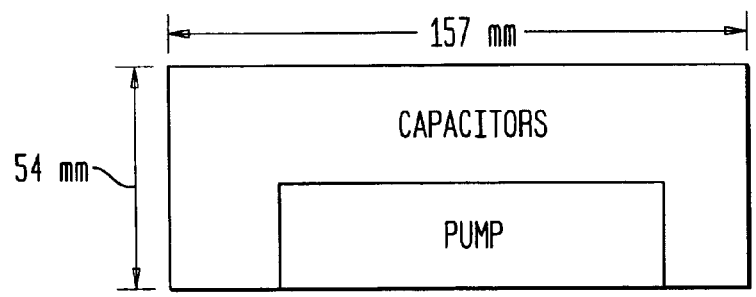
FIGS. 4A and 4B are layout plans, respectively, for the existing charge pump and a charge pump according to the present invention.

This alternate pumping action allows the pump to have a high efficiency. During the first cycle of pump action, the charge is stored in capacitor C1. Therefore, capacitor C1 will not suffer excessive stress. Since capacitor C2 is used to maintain the voltage of nodes A1a and B1a, this capacitor also will not suffer excessive stress. On the other hand, the boost capacitor C3 will experience excessive stress because the node A2 gets boosted from Vcc to 3 Vcc. The capacitor C3 requires special attention so that it will not break down or suffer any kind of degradation during the life time of the pump. Currently, the capacitors are formed by thick oxide planar structure, which results in a large layout area as shown in FIG. 4A.

Figure 3:
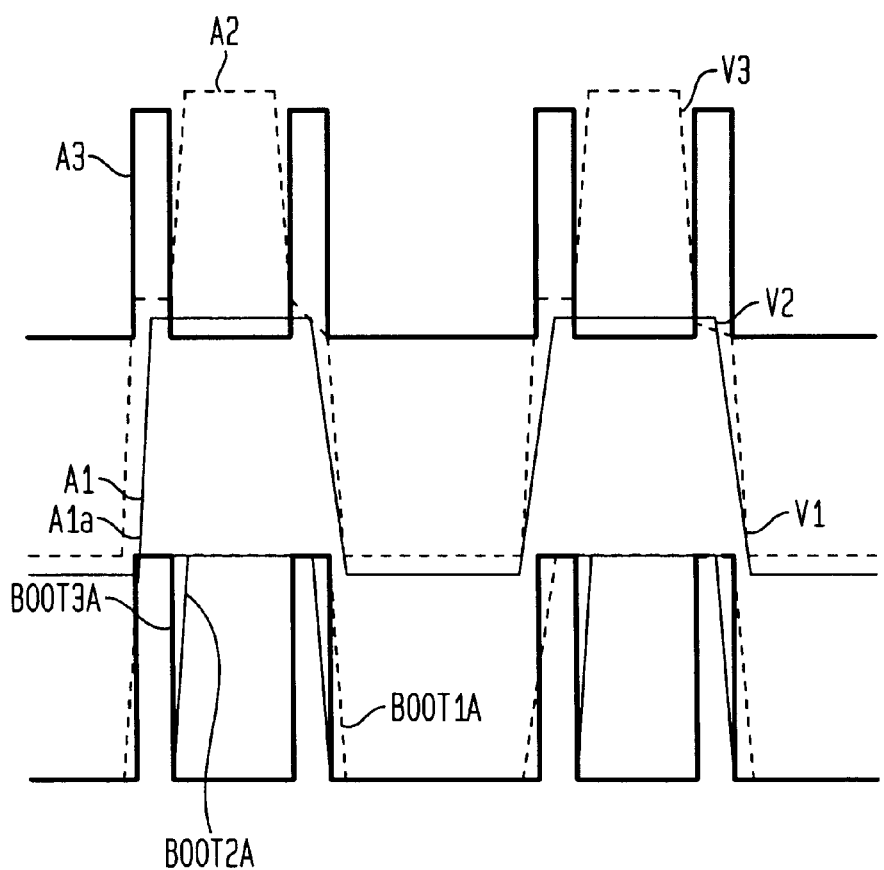
FIG. 3 is a timing diagram of the charge pump circuit of FIG. 2.

The timing diagram of the pump circuit is shown in FIG. 3. When the clock BOOST1A is pulsed from ground to V1, both nodes A1 and A1a are boosted from V1 to V2. In the meantime, the clock BOOST3A is pulsed from ground to V1 which boosts the node A3 up from V2 to V3 accordingly. The clock pulse of BOOST2A is then up from ground to V1 and subsequently node A2 gets boosted from V1 to V2 then to V3. The voltage stress across the capacitor C4 between node BOOST3A and node A3 is basically maintained within one Vcc. Similarly, the node stress across capacitors C1 and C2 are all at about one Vcc. However, the voltage stress across capacitor C3 between nodes BOOST2A and node A2 will be at least 2 Vcc.

Figure 5:
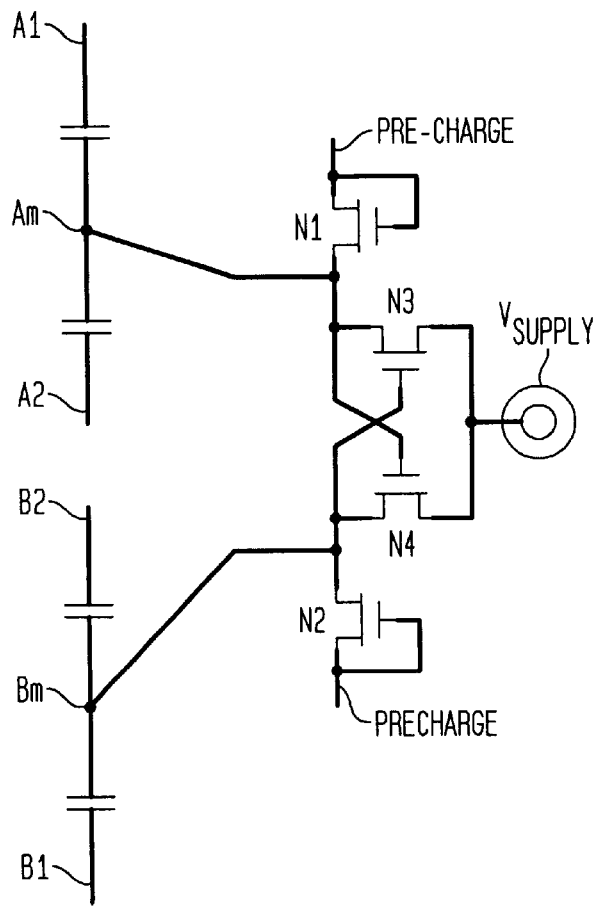
FIG. 5 is a schematic circuit diagram of a dynamic voltage clamping circuit used to clamp the intermediate node of two capacitors connected in series.
Figure 6:
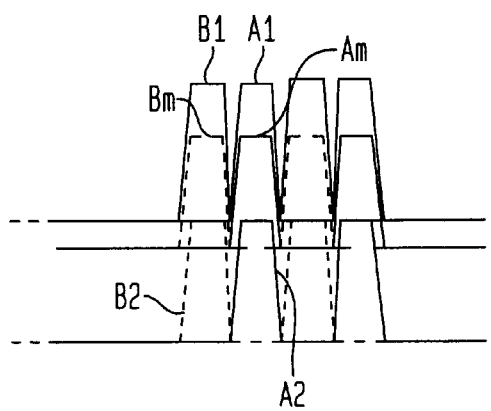
FIG. 6 is a timing diagram showing the operation of the clamping circuit of FIG. 5.

A dynamic voltage clamping circuit shown in FIG. 5 is used to clamp the intermediate node of two serially stacked capacitors. As mentioned, the pump is designed in a symmetrical way. When the upper portion of the pump is in a pumping action, the lower portion is in a pre-charging action, and vice versa. In order to reduce the high voltage across the problematic capacitors, we stack the capacitors in series. For example, the upper capacitor C3 can be formed with two capacitors in series, each twice the size as before. Therefore, the effective capacitance value is maintained the same. The two intermediate nodes Am and Bm are now clamped firstly by diodes of N1 and N2, respectively. Therefore, during power-on, these two nodes will be precharged to (Vcc–Vthn), or an nMOS device's threshold (Vthn) lower than the supply voltage (Vcc) level. These two intermediate nodes Am and Bm are clamped also by cross-coupled nMOS transistors N3 and N4. During pump operation, the voltage levels of Am and Bm nodes are alternatively charged and boosted according to the pump clock cycle. In other words, during each pump cycle, when the clock at node A1 is high, the clock at node B1 must be low, and vice versa. When the clock at node A1 is boosted, the intermediate node Am is coupled up, at the same time intermediate node Bm is pre-charged to (Vcc–Vthn). The waveforms of the clocks and the intermediate voltages are shown in FIG. 6. During the next cycle, the intermediate node Bm is coupled up with the B1 clock, while the intermediate node Am is pre-charged. With this arrangement, the voltage across any of the capacitors is restricted within a safety range without affecting the pump efficiency.

A straight-forward approach is to clamp nodes Am and Bm using a reference voltage, also called the static clamp method. There are two disadvantages with is approach. First, the reference voltage must be provided using a circuit which is much bigger in size than the clamping devices described here. Second, the static clamping is not as efficient as the dynamic clamping. The reference voltage tends to clamp both nodes Am and Bm at the fixed level at all times. If the reference voltage is not strong enough, the voltage across the capacitor can exceed the safety limit. On the other hand, if the reference voltage level is too strong, the pump efficiency will be degraded.

Figure 4B:
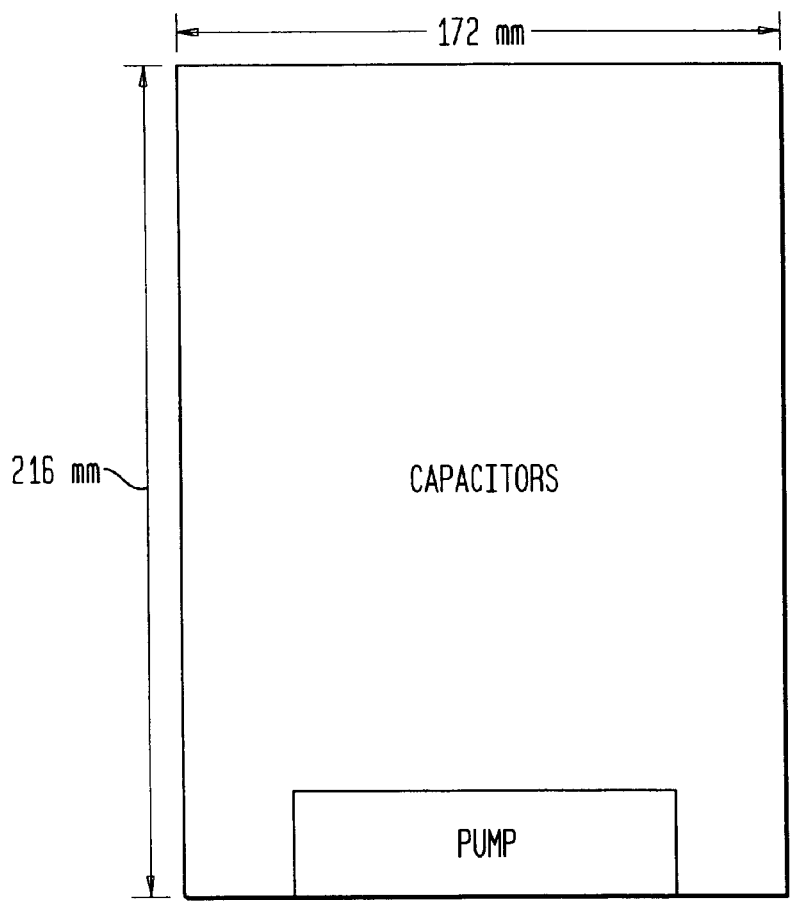

The supply voltage level must be carefully chosen in order to dynamically adjust the Am and Bm voltages to be in the middle of the maximum voltage range. We propose to use Vin (or about 1.9V) for the capacitor C3, and Vblh (or about 1.6V) (Vblh is an internally generated voltage for DRAM bit line operation) for the capacitor C2 clamping. In order to save the pump layout area, any existing on-chip high density capacitor can be used as the boost or reservoir capacitors for the pump. These capacitors include a deep trench capacitor, three-dimensional (3D) stacked capacitors, or a capacitor with high-k dielectric constant, etc. A layout of the same charge pump using deep trench capacitors is shown in FIG. 4B. The total size of the pump including extra capacitors needed to stack them is still less than one quarter the original layout shown in FIG. 4A. The use of deep-trench capacitors for the boost capacitor of the charge pump circuit requires no extra cost to process.

Figure 7:
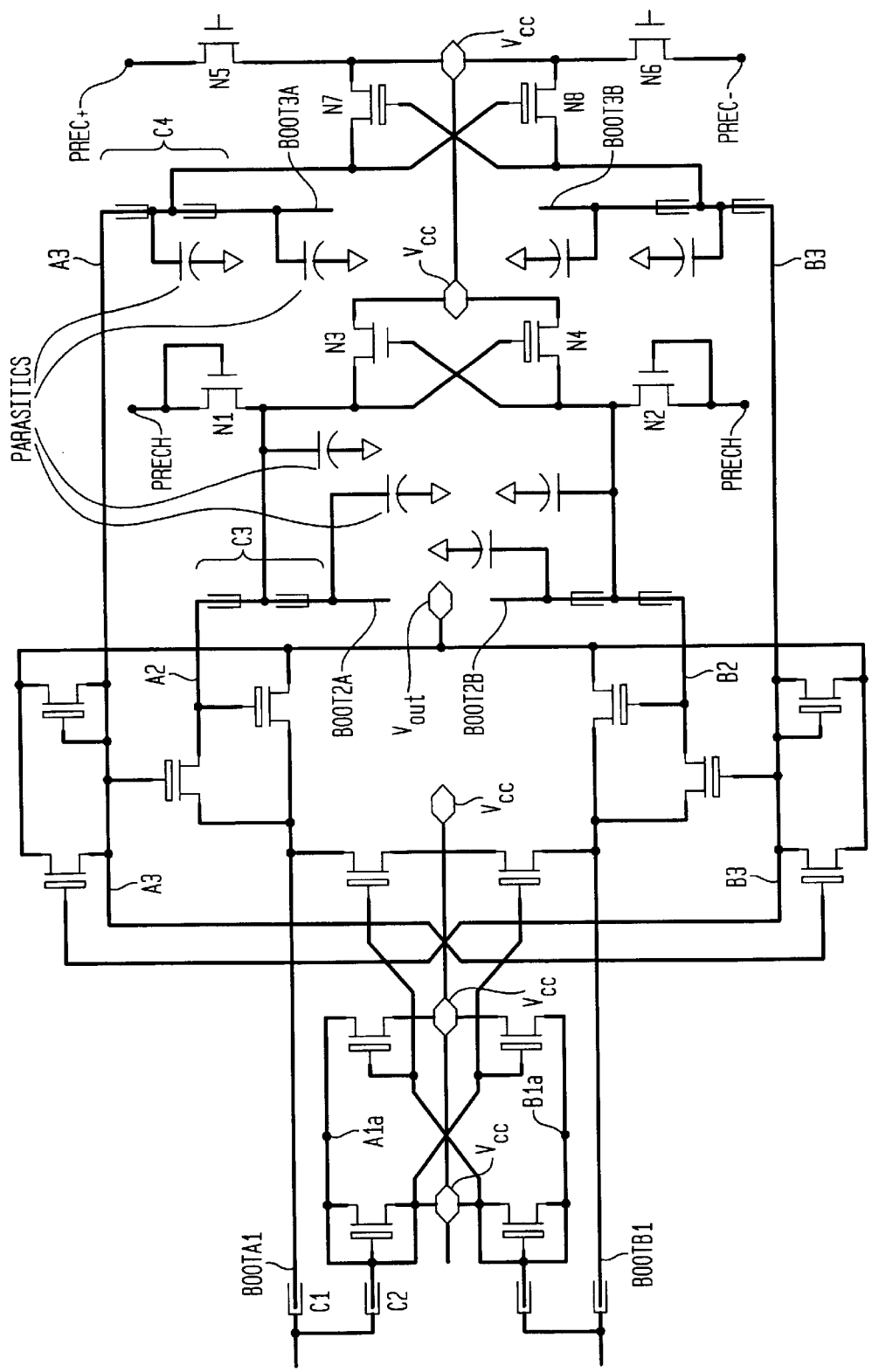
FIG. 7 is schematic circuit diagram of the charge pump circuit using deep trench capacitors according to a preferred embodiment of the invention.

In FIG. 7, the schematic of a pump circuit using deep trench capacitors is shown. In this schematic diagram, parasitic capacitors, such as the capacitance due to P-well and plate, etc., are all included in the simulation and evaluation and will be discussed more later. The first embodiment is to replace all the planar capacitors with deep trench capacitors to save the area. The second embodiment is to replace only those with large size capacitors, such as capacitors C1 and C3. To optimize the performance, we are able to further increase the capacitor size which was forbidden due to area constraints when using planar type capacitors; for example, the size of capacitor C1 is doubled. To optimize the reliability protection, we keep the ratio of two stacked deep trench capacitors sizes of C3 and C4 to be in the ranges 1:2 to 1:3, so that the voltage stress across the two capacitors will be distributed more evenly.

For example, capacitor C3 is now replaced with two deep-trench capacitors connected in series. Note that each deep-trench capacitor is formed by a group of small deep-trench capacitors identical to those in the cell of the memory array and connected in parallel. Cross-coupled boosted devices N4, N5 are used to dynamically clamp the intermediate node between two deep-trench capacitors. Pre-charge devices N1 and N2 are used to pre-charge the same nodes during power-on. A similar arrangement is made for capacitor C4 as shown in FIG. 7.

Figure 8:
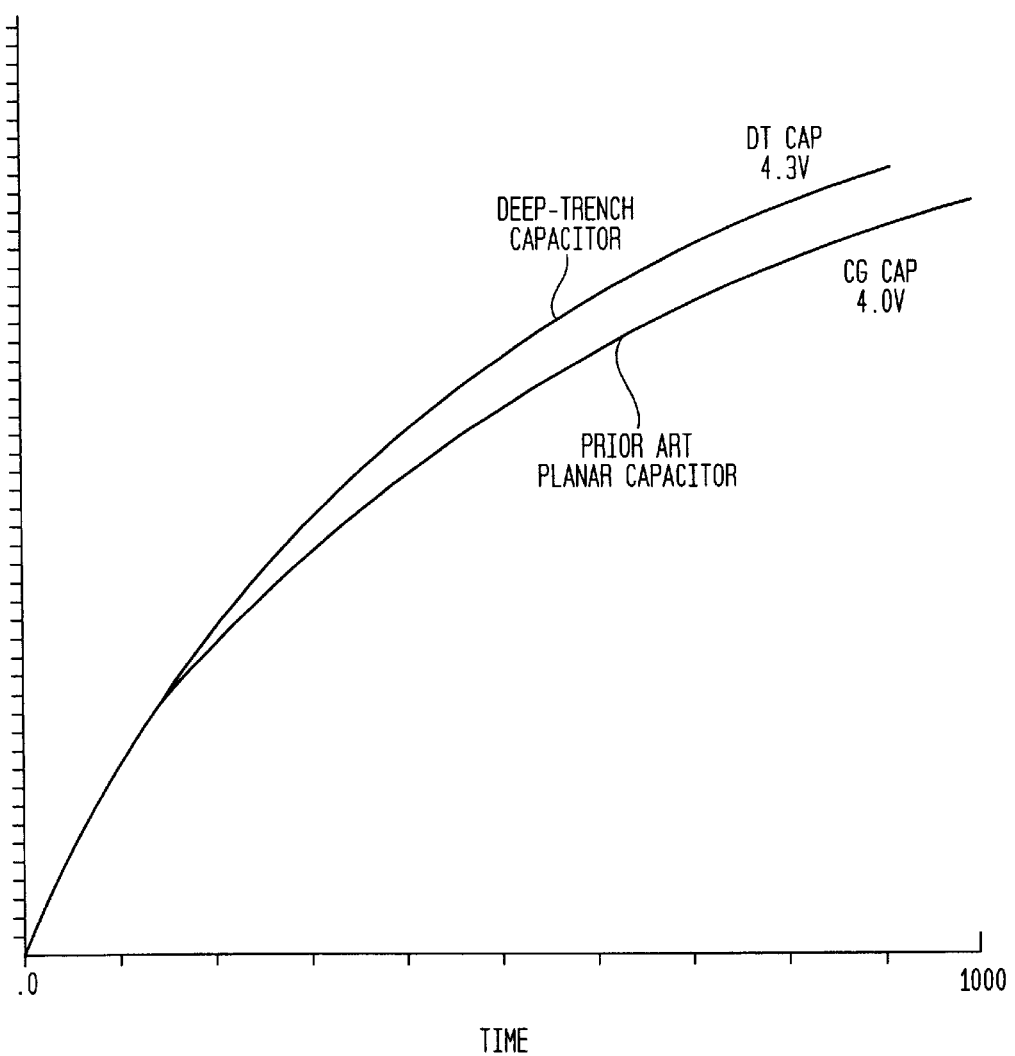
FIG. 8 is a graph showing the difference in the ramp-up rates between the old and new charge pump circuits.
Figure 9:
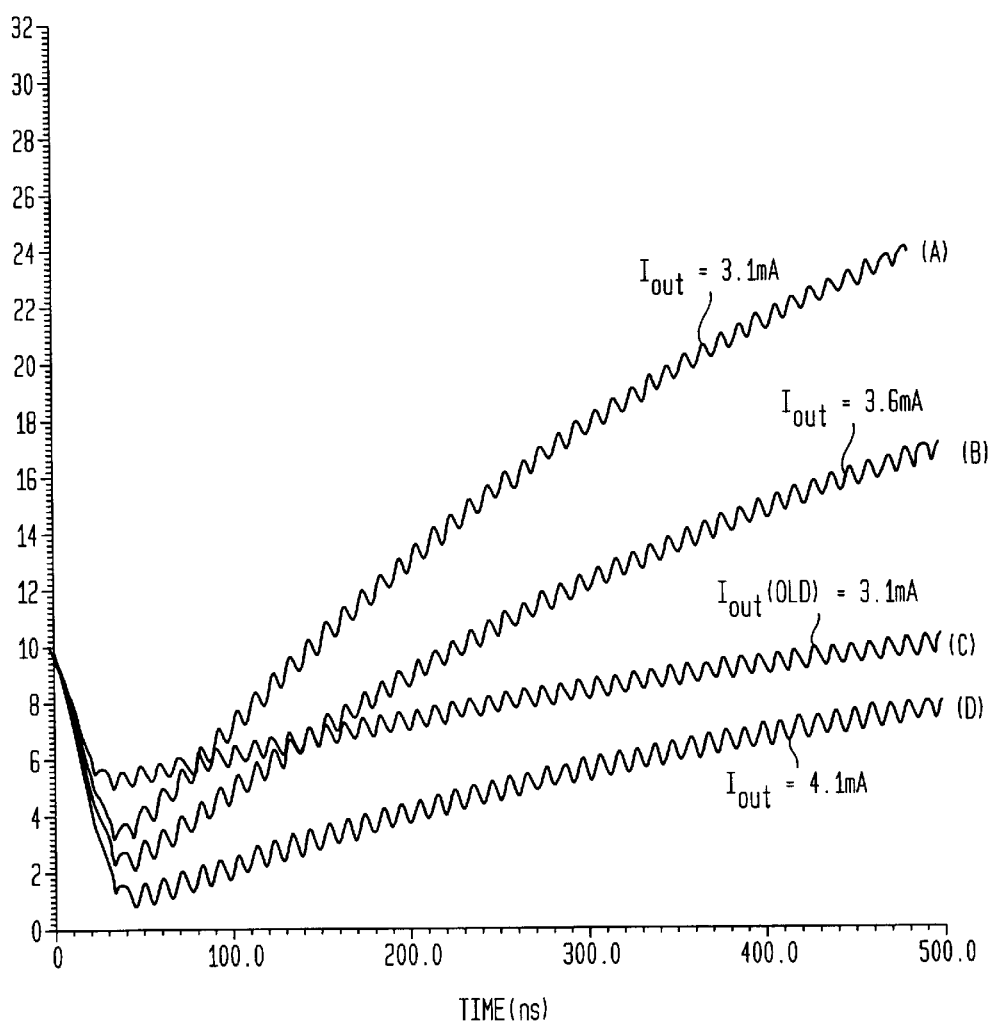
FIG. 9 is a graph showing the difference between the current supply capacity of the new and old charge pump circuits.

The pump strength is improved significantly. The ramp-up rate between the new and the old pumps are shown in FIG. 8. Within 1000 ns the new pump with deep trench capacitors will reach 4.3V, while the old pump with planar capacitors reaches only 4V. The current supply capacity of the new pump is 26% better than the old pump, as shown in FIG. 9. In FIG. 9, the upper two waveforms (A) and (B) are the Vout of the charge pump using deep-trench capacitors as the boost capacitor. Waveform (A) is the Vout waveform when the charge pump is constantly withdrawing a load of 3.1 mA, while waveform (B) is Vout with a load of 3.6 mA. On the other hand, waveforms (C) and (D) are Vout waveforms of a charge pump using a conventional planar capacitor as the boost capacitor. Waveform (C) is Vout when the output load is 3.1 mA, while waveform (D) is when the output load is 4.1 mA. Since the planar boost capacitor is smaller than that of the deep-trench capacitor, the charge pump capacity is poorer.

Figure 10A:
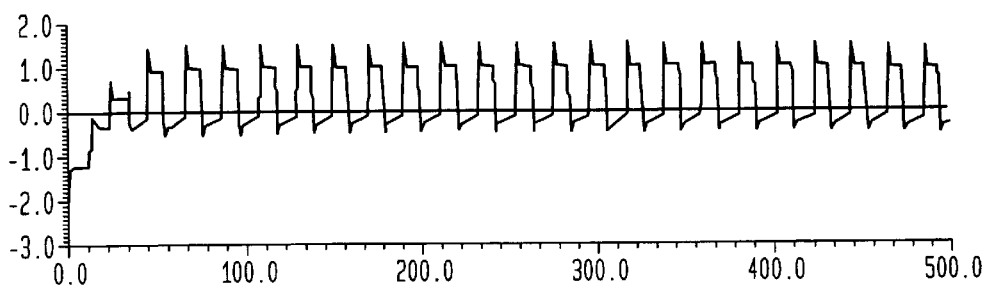
FIGS. 10A, 10B and 10C are waveforms showing, respectively, the voltage stress of the first capacitor, the second capacitor and, for comparison, a single capacitor, respectively.
Figure 10B:
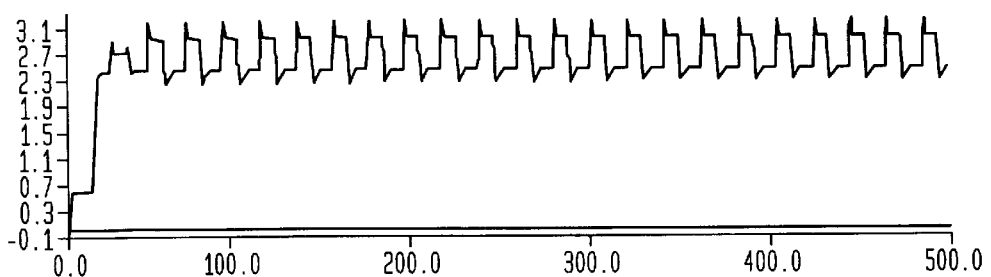
Figure 10C:
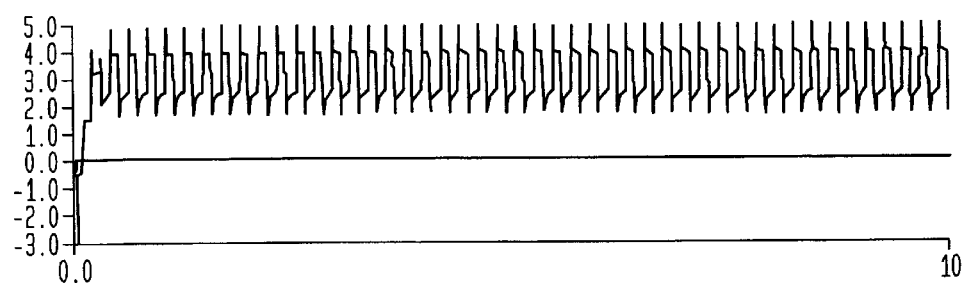
Figure 11A:
FIGS. 11A and 11B are waveforms of voltage stress across the first capacitor and the second capacitor, respectively for dynamic clamping with Vint supply.
Figure 11B:
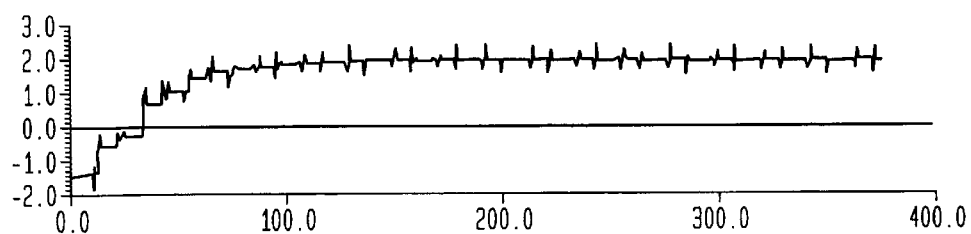
Figure 12A:
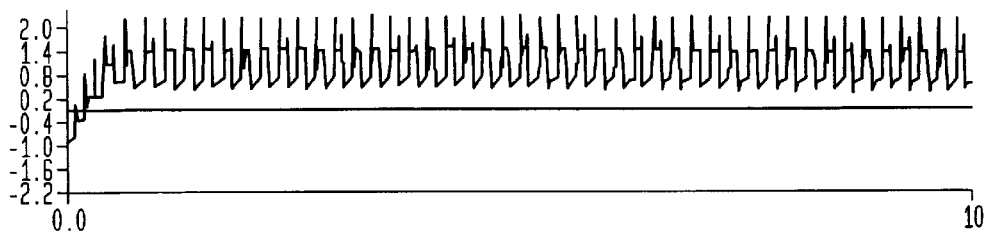
FIGS. 12A and 12B are waveforms of voltage stress across the first capacitor and the second capacitor, respectively, for dynamic clamping with Vblh supply.
Figure 12B:
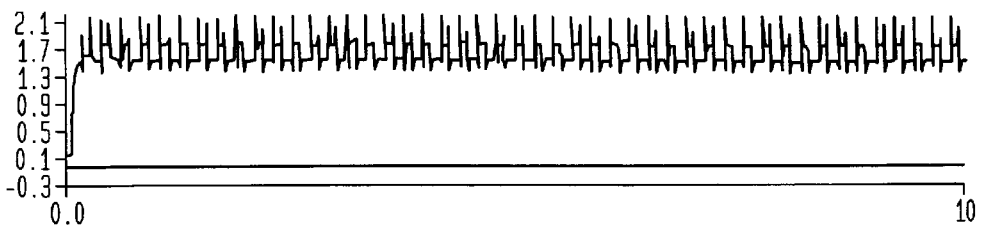

The voltage stress across the capacitors are compared. First, we use Vext (2.5V) to clamp the intermediate nodes Am and Bm. FIGS. 10A and 10B are the voltage stress across each of the two stacked deep trench capacitors; i.e., 1V and 3.05V. Compared to that across a single planar capacitor of 3.88V, the reliability improvement is obvious. But we are not satisfied with the results, since 3V, actually 2.5V with 100% duty cycle, is still too high for the deep trench capacitors. In FIG. 11, we use Vint (1.9V–2.1V) to clamp the capacitors. The results are satisfactory, the maximum capacitor stress is now less than 2.0V. In FIG. 12, the clamp voltage is further reduced to Vblh (1.6V), and the maximum stress is now limited below 1.76V. Without using high density deep-trench capacitors, the size of the pump will be significantly increased by using two capacitors in series. Since when connecting them in series, each capacitor size is physically increased by four times.

Figure 13A:
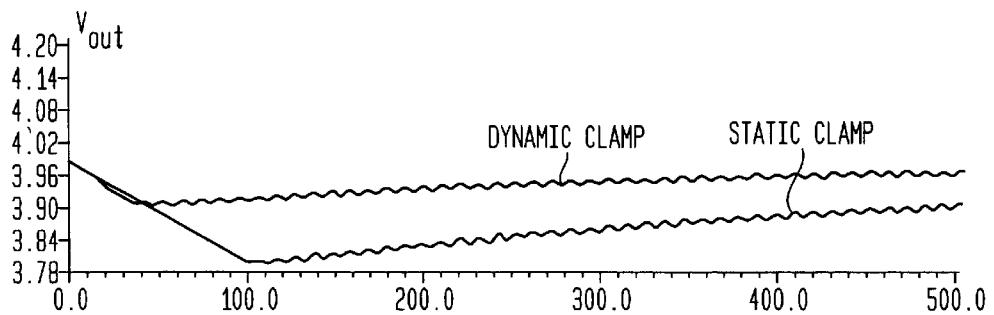
FIG. 13A are waveforms of pump output voltage comparison between dynamic and static clamps.
Figure 13B:
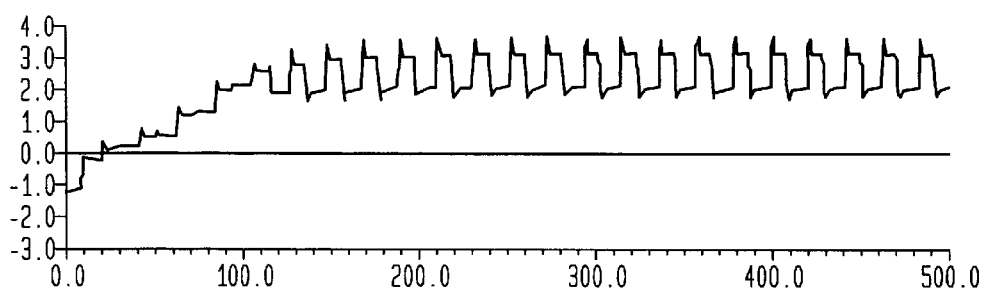
FIGS. 13B and 13C are, respectively, waveforms of the voltage stress across the first and second capacitors in the static clamp situation.
Figure 13C:
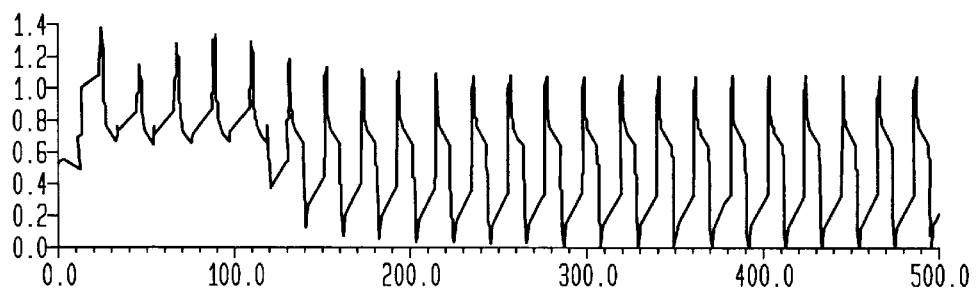

The result of dynamic clamp technique is compared to that of a static clamp. Here, the static clamp is formed by using a wide channel length of pMOS device (L=3 Fm, W=1 Fm) to tie the intermediate node to the Vcc supply. Under the identical condition, the dynamic clamp technique results in more pumping efficiency. As shown in FIG. 13A, the pump with dynamic clamp has a stronger pumping power. In FIGS. 13B and 13C, the static clamp shows 01V higher voltage stress on one of the stacked deep trench capacitors.

To form a large capacitor using a deep trench capacitor has been demonstrated. It has been used to form large size on-chip decoupling capacitor. But it has never been used in the active components before. For the deep trench capacitor to be used as the boost capacitors in the charge pump, one major concern is the parasitic effect on pump performance. These parasitic components include plate resistance, trench resistance, strap resistance, channel resistance, parasitic capacitance plate to well, plate to substrate, etc. During charge pump performance study, these undesirable parasitic components were included in the simulation. Our study concludes that a simplified trench capacitor model can be used to represent the full trench capacitor network, including all the mentioned parasitic components. It suggests that the model should have a 30 kS resistor connected in series to each cell capacitor.

Other than deep-trench capacitors, other high-density capacitors, such as high-k dielectric and 3D stack capacitors, can be employed in a similar way to avoid high oxide stress while improving charge pump efficiency in the practice of the invention. This invention only focuses on the charge pump circuit since the voltage stress is a dynamic stress and a cross-coupled pre-charge device can be easily provided to clamp the intermediate node of two capacitors in series.

While the invention has been described in terms of preferred embodiments, those skilled in the art will recognize that the invention can be practiced with modification within the spirit and scope of the appended claims.

Having thus described our invention, what we claim as new and desire to secure by Letters Patent is as follows:

1. A semiconductor charge pump circuit comprising:
   a first capacitor connected between a first clock terminal and a first node;
   a pre-charge circuit connected to said first node for pre-charging said first node to a supply voltage;
   means for applying a pulsed voltage equal to said supply voltage to said first clock terminal thereby boosting a voltage at said first node to twice the supply voltage;
   a pair of boost capacitors connected in series between a second clock terminal and a second mode, said pair of boost capacitors forming a boost capacitance, each of said boost capacitors having a respective capacitance of at least two times that of the boost capacitance;
   at least one dynamic clamping circuit used in conjunction with the pair of boost capacitors, the dynamic clamp being realized using a two stage pump operation cycle such that, during a first stage pump cycle, a middle node of the pair of series connected capacitors is pre-charged to a reference voltage and, during a second stage pump cycle, the middle node is coupled by a boost clock whereby, at any moment in the pump operation cycle, the voltage across the capacitors is held within a safety range;
   a pass gate connecting said first node to said second node;
   means for pulsing said pass gate to boost said second node to twice the supply voltage; and
   means for applying a pulsed voltage equal to said supply voltage to said second clock terminal thereby boosting a voltage at said second node to approximately three times the supply voltage.

2. The semiconductor charge pump circuit of claim 1, wherein the pump circuit has a symmetrical design and further comprises:
   a second capacitor connected between a third clock terminal and a third node;
   a second pre-charge circuit connected to said third node for pre-charging said third node to a supply voltage;
   second means for applying a pulsed voltage equal to said supply voltage to said third clock terminal thereby boosting a voltage at said third node to twice the supply voltage;

a second pair of boost capacitors connected in series between a fourth clock terminal and a fourth node, said second pair of boost capacitors replacing a high stress boost capacitor and each having a capacitance at least two times the high stress capacitor;

a second dynamic clamping circuit used in conjunction with the second pair of boost capacitors, the second dynamic clamp being realized using a two stage pump operation cycle such that, during a first stage pump cycle, a middle node of the second pair of series connected capacitors is pre-charged to a reference voltage and, during a second stage pump cycle, the middle node is coupled by a boost clock whereby, at any moment in the pump operation cycle, the voltage across the capacitors is held within a safety range;

a second pass gate connecting said third node to said fourth node;

second means for pulsing said second pass gate to boost said fourth node to twice the supply voltage; and second means for applying a pulsed voltage equal to said supply voltage to said fourth clock terminal thereby boosting a voltage at said second node to approximately three times the supply voltage, whereby an alternate pumping action is realized by the symmetrical design of the charge pump circuit.

3. The semiconductor charge pump circuit of claim 1, wherein the pair of capacitors are high-density deep trench capacitors.

4. The semiconductor charge pump circuit of claim 1, wherein the pair of capacitors are high dielectric constant capacitors.

5. The semiconductor charge pump circuit of claim 1, wherein the pair of capacitors are 3D high-density capacitors.

6. The semiconductor charge pump circuit of claim 1, wherein the charge pump circuit is incorporated in a dynamic random access memory (DRAM) array and the pair of capacitors are a same type of capacitor used in cells of the DRAM array.

7. The semiconductor charge pump circuit of claim 6, wherein each of the pair of capacitors are formed by a plurality of capacitors of the same type of capacitor used in cells of the DRAM array, the plurality of capacitors forming each of the pair of capacitors being connected in parallel.

8. The semiconductor charge pump circuit of claim 1, wherein the reference voltage is supplied by an externally generated supply voltage.

9. The semiconductor charge pump circuit of claim 1, wherein the reference voltage is an internally generated voltage.

10. The semiconductor charge pump circuit of claim 1, wherein an area ratio of the pair of capacitors is such that voltages across each capacitor are evenly distributed.

* * * * *